United States Patent
Ito et al.

(10) Patent No.: US 11,240,926 B2
(45) Date of Patent: Feb. 1, 2022

(54) TRAY AND ELECTRONIC DEVICE

(71) Applicant: SHARP KABUSHIKI KAISHA, Sakai (JP)

(72) Inventors: Yuta Ito, Sakai (JP); Kenzoh Daimon, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/010,667

(22) Filed: Sep. 2, 2020

(65) Prior Publication Data

US 2021/0084783 A1 Mar. 18, 2021

(30) Foreign Application Priority Data

Sep. 13, 2019 (JP) .............................. JP2019-167565

(51) Int. Cl.
*H05K 5/02* (2006.01)
*H04M 1/02* (2006.01)
*H04B 1/3816* (2015.01)

(52) U.S. Cl.
CPC ......... *H05K 5/0286* (2013.01); *H04B 1/3816* (2013.01); *H04M 1/026* (2013.01)

(58) Field of Classification Search
CPC .................................................. H05K 5/0286
See application file for complete search history.

(56) References Cited

U.S. PATENT DOCUMENTS

| 7,306,491 | B1* | 12/2007 | Wei | ...................... | H01R 13/629 |
| | | | | | 235/441 |
| 2013/0044452 | A1* | 2/2013 | Tang | ..................... | G06F 1/1658 |
| | | | | | 361/807 |
| 2014/0016275 | A1 | 1/2014 | Takasaki et al. | | |
| 2018/0219312 | A1* | 8/2018 | Joo | .................... | G06K 13/0887 |

FOREIGN PATENT DOCUMENTS

JP 2013-134975 A 7/2013

* cited by examiner

*Primary Examiner* — Hsinchun Liao
(74) *Attorney, Agent, or Firm* — ScienBiziP, P.C.

(57) ABSTRACT

A tray inserted in an electronic device, and housing a card removable from the electronic device, the tray includes: a first interior wall partially defining a housing space housing the card; a second interior wall facing the first interior wall, and partially defining the housing space; and an elastic member provided to the second interior wall, wherein the elastic member is formed of rubber, and configured to change in shape in conformity with a shape of the card while the card is housed in the tray, and to apply to the card elastic force toward the first interior wall.

6 Claims, 5 Drawing Sheets

TRAY AND ELECTRONIC DEVICE

CROSS-REFERENCE TO RELATED APPLICATION

The present application claims priority from Japanese Application JP2019-167565, the content of which is hereby incorporated by reference into this application.

BACKGROUND OF THE INVENTION

1. Field of the Invention

The present invention relates to a tray which houses a card removable from an electronic device, and the electronic device including the tray.

2. Description of the Related Art

Japanese Unexamined Patent Application Publication No. 2013-134975 discloses a card tray including: a front plate facing a front end of a card; and a back plate facing a back end of the card. The tray includes a card holding spring provided close to the back plate and biasing the card forward, and holds the card longitudinally.

SUMMARY OF THE INVENTION

In the tray disclosed in Japanese Unexamined Patent Application Publication No. 2013-134975, the card holding spring is formed of a metal plate constituting the tray. The metal plate is processed by, for example, punching and bending to have the card holding spring. The card holding spring bends while the card is housed in the tray, and thus requires a space across from the card to relieve the bending. Unfortunately, such a configuration makes it difficult to downsize the tray.

An aspect of the present invention intends to provide a small tray capable of holding a card.

In order to overcome the above problem, a tray according to an aspect of the present invention is inserted in an electronic device and houses a card removable from the electronic device. The tray includes: a first interior wall partially defining a housing space housing the card; a second interior wall facing the first interior wall, and partially defining the housing space; and an elastic member provided to the second interior wall, wherein the elastic member is formed of rubber, and configured to change in shape in conformity with a shape of the card while the card is housed in the tray, and to apply to the card elastic force toward the first interior wall.

An aspect of the present invention can provide a small tray capable of holding a card.

DETAILED DESCRIPTION OF THE INVENTION

First Embodiment

Described below in detail is an embodiment of the present invention.

Figure 2:
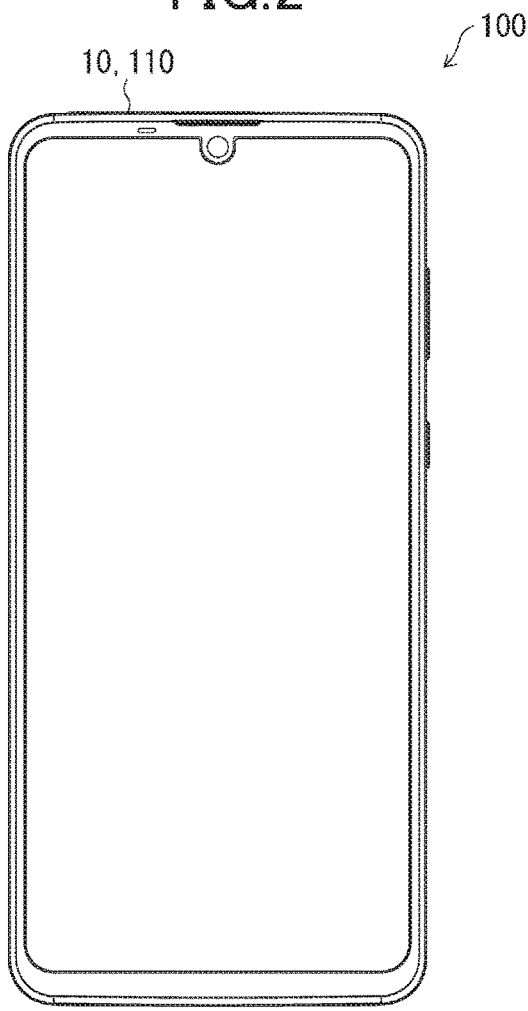
FIG. 2 is a front elevation of a personal digital assistant (PDA) according to a first embodiment.
Figure 2:
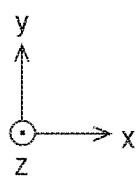
Figure 3:
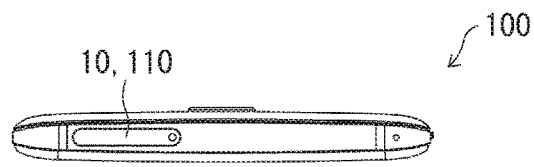
FIG. 3 is a top view of the PDA according to the first embodiment.
Figure 3:
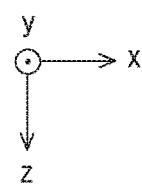
Figure 4:
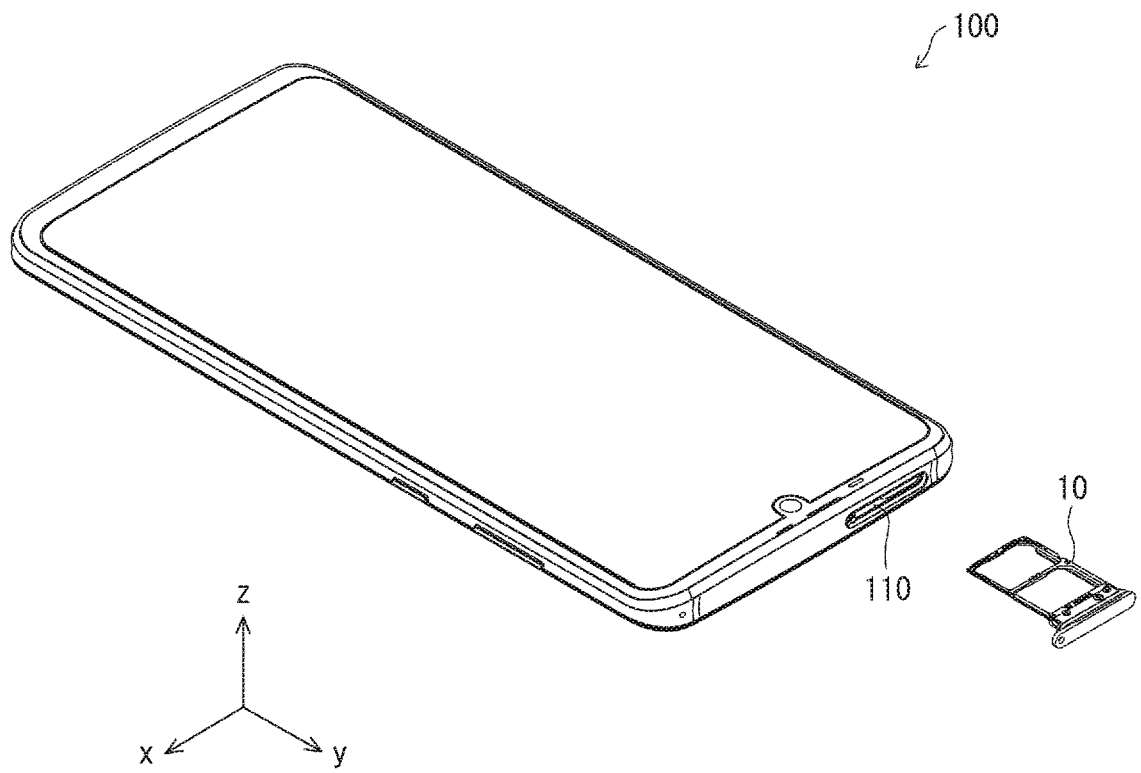
FIG. 4 is a perspective view of the PDA according to the first embodiment.

FIG. 2 is a front elevation of a PDA 100 (an electronic device) according to a first embodiment. FIG. 3 is a top view of the PDA 100. FIG. 4 is a perspective view of the PDA 100. The PDA 100 includes a tray 10 inserted in the PDA 100 and housing a card removable from the PDA 100. An example of the card includes a SIM card or various kinds of memory cards. Note that the tray 10 may be included in an electronic device other than a PDA.

Specifically, as illustrated in FIGS. 2 to 4, the PDA 100 includes, on a top face thereof, the tray 10 housing a card, and a tray slot 110 in which the tray 10 is inserted. FIG. 4 illustrates the tray 10 removed from the PDA 100. The tray 10 in which the card is housed is inserted in the tray slot 110, such that the card is installed in the PDA 100.

Figure 1:
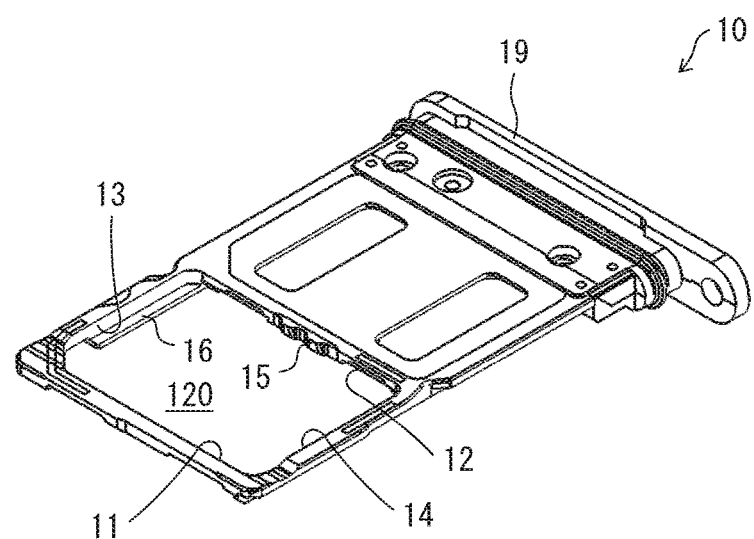
FIG. 1 is a perspective view of a tray according to a first embodiment.
Figure 1:
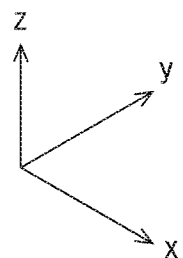

FIG. 1 is a perspective view of the tray 10 according to the first embodiment. As illustrated in FIG. 1, the tray 10 includes: a first interior wall 11; a second interior wall 12; a third interior wall 13; a fourth interior wall 14; an elastic member 15; a fall-out prevention stopper 16; and a lid 19.

The first interior wall 11, the second interior wall 12, the third interior wall 13, and the fourth interior wall 14 define a housing space 120 housing the card. The second interior wall 12 faces the first interior wall 11. The third interior wall 13 connects together an end of the first interior wall 11 and an end, of the second interior wall 12, facing the end of the first interior wall 11. In FIG. 1, the tray 10 includes an inner wall connecting the first interior wall and the third interior wall 13 together. For the sake of simplifying, the connecting inner wall is interpreted to be a part of the third interior wall 13. The fourth interior wall 14 faces the third interior wall 13. Moreover, the fourth interior wall 14 connects together: an end, of the first interior wall 11, across from the third interior wall 13; and an end, of the second interior wall 12, across from the third interior wall 13.

The first interior wall 11 of the tray 10 may be provided in any given position. Hence, for example, any one of the second interior wall 12 to the fourth interior wall 14 in FIG. 1 may be the first interior wall 11.

The second interior wall 12 is not necessarily in parallel with, but may be angled in relation to, the first interior wall 11. Moreover, the fourth interior wall 14 is not necessarily in parallel with, but may be angled in relation to, the third interior wall 13.

Moreover, the tray 10 may further include an interior wall other than the first interior wall 11 to the fourth interior wall 14 to define the housing space 120 in conformity with a shape of the card. In other words, the tray 10 may include any given number of interior walls.

The first interior wall 11 and the second interior wall 12 are preferably formed of metal. So are the third interior wall 13 and the fourth interior wall 14. An example of the metal includes aluminum, stainless steel, or magnesium. The first interior wall 11 to the fourth interior wall 14 formed of metal can provide the tray 10 with high strength.

The elastic member 15 changes in shape in conformity with the shape of the card to be housed in the tray 10, and applies to the card elastic force toward the first interior wall 11. The elastic member 15 is provided to the second interior wall 12. Hence, the card is held between the first interior wall 11 and the elastic member 15. The elastic member 15 applies the elastic force to the card in the –y-direction represented by axes illustrated in FIG. 1.

The elastic member 15 is formed of rubber. Rubber is flexible in all directions, and unlike, for example, a metal spring, eliminates the need of a space to be provided across from the card to relieve the bending of the metal spring. Hence, the elastic member 15 formed of rubber makes it possible to downsize the tray 10.

Moreover, for example, a tray could be partially processed by, for example, punching and bending, so that the processed portion would be used as a spring instead of the elastic member 15. Unfortunately, such a configuration decreases the strength of the tray. In contrast, the tray 10 is not subjected to the processing such as punching and bending, and thus kept from a decrease in strength.

The rubber forming the elastic member 15 includes, for example, silicone rubber, polyurethane, or fluorine-containing rubber. The elastic member 15, formed of such rubber, applies appropriate elastic force against the card housed in the tray 10. Note that the rubber to be adopted for forming the elastic member 15 may have an elasticity as low as that of the above material (e.g., silicone rubber, polyurethane, or fluorine-containing rubber).

The elastic member 15 is formed of rubber as a material attached with an adhesive to, for example, the second interior wall 12 of the tray 10 previously molded. The attached rubber is press-molded to be the elastic member 15. Alternatively, the elastic member 15 may be previously molded rubber to be attached with an adhesive to the second interior wall 12.

The fall-out prevention stopper 16 is a member to prevent the card from falling out of the tray 10. The fall-out prevention stopper 16 defines a bottom face of the housing space 120 for housing the card. The fall-out prevention stopper 16 may be formed of any given material. For example, similar to the first interior wall 11 to the fourth interior wall 14, the fall-out prevention stopper 16 may be formed of metal. Alternatively, the fall-out prevention stopper 16 may be formed of resin.

Preferably, the fall-out prevention stopper 16 is provided to the third interior wall 13 or the fourth interior wall 14. In the example illustrated in FIG. 1, the fall-out prevention stopper 16 is provided to the third interior wall 13. Hence, as to the tray 10 illustrated in FIG. 1, the card can be easily placed in the tray 10 across from the second interior wall 12 provided with the elastic member 15 and the third interior wall 13 provided with the fall-out prevention stopper 16. Note that the fall-out prevention stopper 16 may be provided to both the third interior wall 13 and the fourth interior wall 14. Furthermore, the fall-out prevention stopper 16 may be provided to either one of, or both, the first interior wall 11 and the second interior wall 12.

The lid 19 is a lid of the tray slot 110 while the tray 10 is inserted in the tray slot 110. The lid 19 is formed to be substantially flush with the top face of the PDA 100 while the tray 10 is inserted in the tray slot 110. Such a feature reduces the risk that, while the tray 10 is inserted in the tray slot 110, the lid 19 collides with an object outside such that the tray 10 comes off the PDA 100.

Figure 5:
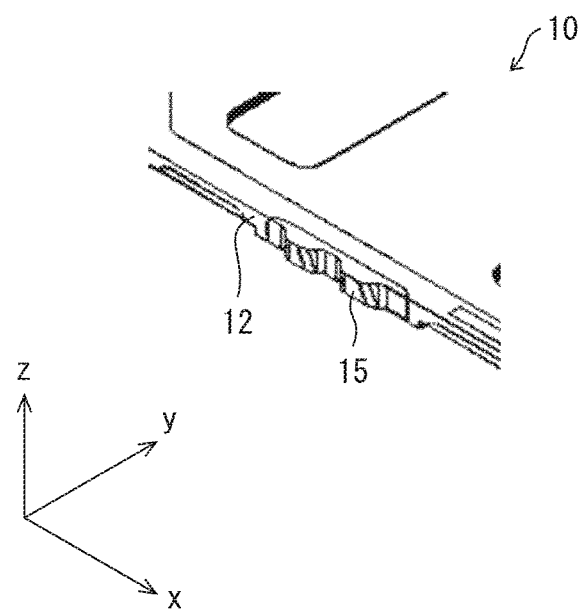
FIG. 5 is an enlarged view around an elastic member in FIG. 1.
Figure 6:
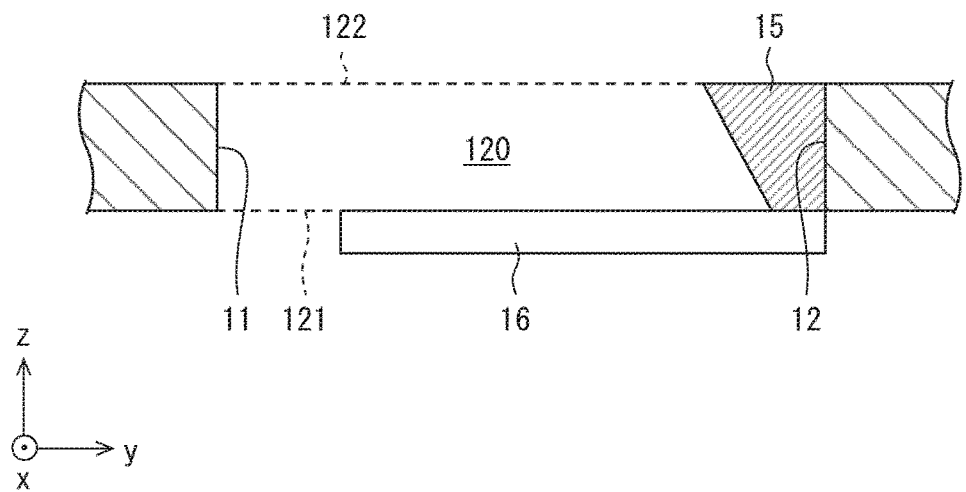
FIG. 6 is a cross-sectional view of the tray illustrated on a plane determined by a direction in which a first interior wall and a second interior wall face each other and by a direction perpendicular to a bottom face of a housing space.

FIG. 5 is an enlarged view around the elastic member 15 in FIG. 1. FIG. 6 is a cross-sectional view of the tray 10 illustrated on a plane (hereinafter "yz plane") determined by a direction (a y-direction in FIGS. 5 and 6) in which the first interior wall 11 and the second interior wall 12 face each other and by a direction (a z-direction in FIGS. 5 and 6) perpendicular to the bottom face 121. As illustrated in FIG. 6, the housing space 120 has an open face 122 facing the bottom face 121. Here, in the cross-sectional view seen on the yz plane as illustrated in FIGS. 5 and 6, at least a portion of the elastic member 15 is formed so that the distance between a wall face of the elastic member 15 and the first interior wall 11 is longer toward the bottom face 121 than toward the open face 122. The wall face of the elastic member 15 is a face of the elastic member 15 facing the first interior wall 11.

Figure 7:
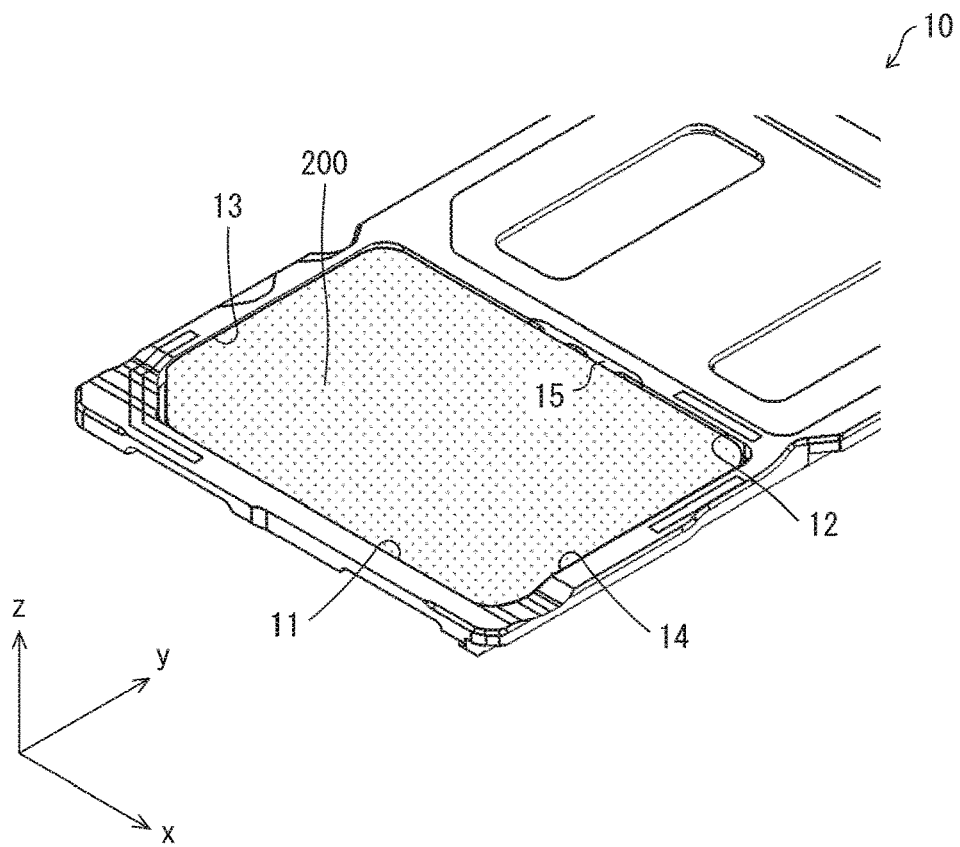
FIG. 7 is a perspective view of the tray in which a subscriber identity module (SIM) card is housed.
Figure 8:
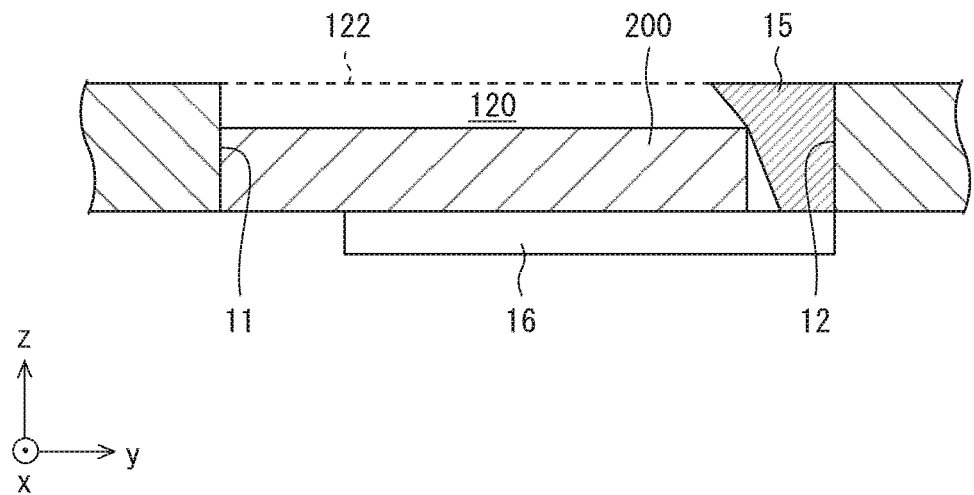
FIG. 8 is a cross-sectional view of the tray in which the SIM card is housed.

FIG. 7 is a perspective view of the tray 10 in which a SIM card 200 is housed. FIG. 8 is a cross-sectional view of the tray 10 in which the SIM card 200 is housed. The SIM card 200 is an example of a card to be housed in the tray 10. Note that, as described above, the tray 10 shall not be limited to the one to house a SIM card. Alternatively, for example, the tray 10 may be the one to house a memory card such as a secure digital (SD) card.

When a metal spring is used instead of the elastic member 15 and the SIM card 200 is to be placed in the tray 10 from a direction other than the direction in which the metal spring is elastic; that is, a direction perpendicular to the open face 122, the problem below might arise. That is, (i) the metal spring plastically might deform to lose a function to hold the SIM card 200, or (ii) the metal spring might make contact with, and damage, the SIM card 200. Hence, when the SIM card 200 is housed in the tray 10, a side of the SIM card 200 is placed in the housing space 120 in advance, and then the side is shifted in parallel with the open face 122 to come into contact with the metal spring.

In contrast, regardless of how to house the SIM card 200, the elastic member 15 appropriately changes in shape in accordance with the movement of the SIM card 200, and then finally changes in shape as illustrated in FIGS. 7 and 8. When the SIM card 200 is housed in the tray 10, the elastic member 15 allows the SIM card 200 to be housed more freely. Moreover, as the shapes illustrated in FIGS. 7 and 8 show, the elastic member 15 applies force against the SIM card 200 toward the bottom face 121, making it possible to stably hold the SIM card 200.

Note that the elastic member 15 does not necessarily have the above shape. In the cross-sectional view on the yz plane, for example, the elastic member 15 may be formed so that the distance between the wall face of the elastic member 15 and the first interior wall 11 is constant from the bottom face 121 to the open face 122.

Note that the PDA 100 may be provided with a plurality of SIM cards. In such a case, the tray 10 may include interior walls defining a plurality of the housing spaces 120, and a plurality of the elastic members 15 each corresponding to one of the housing spaces 120.

Second Embodiment

Described below in detail is another embodiment of the present invention. Note that, for the sake of description, identical reference signs are used to denote identical or substantially identical components between the first embodiment and this embodiment, and therefore will not be elaborated upon.

Figure 9:
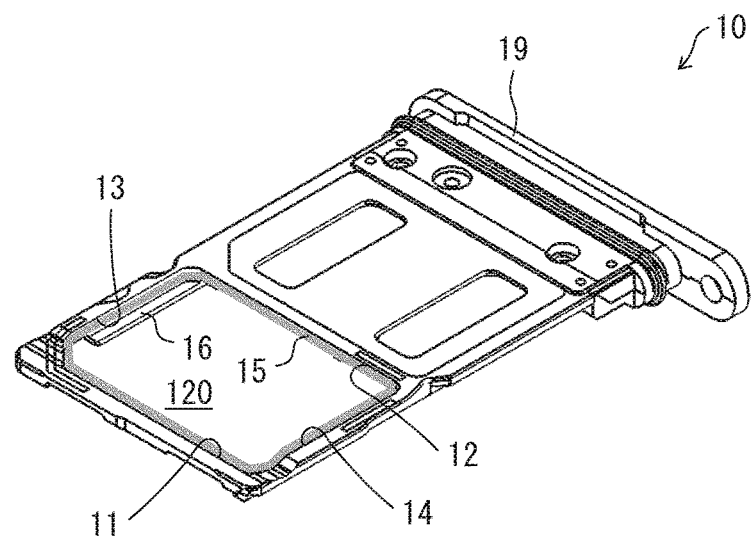
FIG. 9 is a perspective view illustrating an example of a tray according to a second embodiment.

FIG. 9 is a perspective view illustrating an example of the tray 10 according to a second embodiment. In the tray 10 according to the first embodiment, the elastic member 15 is provided only to the second interior wall 12. However, in the tray 10, the elastic member 15 may be provided to interior walls other than the second interior wall 12. For example, as illustrated in FIG. 9, the elastic member 15 may be provided to all of the first interior wall 11 to the fourth interior wall 14.

Furthermore, in the tray 10 according to the first embodiment, the elastic member 15 is provided lengthwise only to a portion of the second interior wall 12. However, as illustrated in FIG. 9, the elastic member 15 may be provided lengthwise throughout the interior walls to which the elastic member 15 is provided.

SUMMARY

A tray according to a first aspect of the present invention is inserted in an electronic device and houses a card removable from the electronic device. The tray includes: a first interior wall partially defining a housing space housing the card; a second interior wall facing the first interior wall, and partially defining the housing space; and an elastic member provided to the second interior wall, wherein the elastic member is formed of rubber, and configured to change in shape in conformity with a shape of the card while the card is housed in the tray, and to apply to the card elastic force toward the first interior wall.

In the above configuration, the tray houses the card in the housing space partially defined by the first interior wall and the second interior wall. The elastic member is provided to the second interior wall, and applies, to the card housed in the housing space, elastic force toward the first interior wall. As a result, the card is held between the first interior wall and the elastic member.

The elastic member is formed of rubber, and flexible in all directions. Hence, unlike, for example, a metal spring, the elastic member eliminates the need of a space to be provided across from the card to relieve the bending of the metal spring. Hence, the tray can be downsized.

A second aspect of the present invention is directed to the tray according to the first aspect. The tray may further include a fall-out prevention stopper provided to define a bottom face of the housing space, and to prevent the card from falling out, wherein, when the housing space has an open face facing the bottom face, in a cross-sectional view, of the elastic member, seen on a plane determined by a direction in which the first interior wall and the second interior wall face each other and by a direction perpendicular to the bottom face, at least a portion of the elastic member may be formed so that a distance between a wall face of the elastic member and the first interior wall is longer toward the bottom face than toward the open face.

In the above configuration, the elastic member appropriately changes in shape in accordance with a manner to house the card; that is, a direction in which the card is shifted when the card is housed, and then finally holds the card stably. Hence, the tray can house the card in any given manner.

A third aspect of the present invention is directed to the tray according to the second aspect. The tray may further include: a third interior wall connecting together an end of the first interior wall and an end, of the second interior wall, facing the end of the first interior wall, the third interior wall partially defining the housing space; and a fourth interior wall facing the third interior wall, and partially defining the housing space, wherein the fall-out prevention stopper may be provided to one of the third interior wall and the fourth interior wall.

In the above configuration, the second interior wall has one end connected to the third interior wall, and another end to the fourth interior wall. The fall-out prevention stopper is provided to the third interior wall or the fourth interior wall. Here, each of the elastic member and the fall-out prevention stopper is provided to a neighboring one of two sides. Hence, the card can be easily placed across from the two sides.

A fourth aspect of the present invention is directed to the tray according to any one of the first to third aspects, wherein the rubber may include silicone rubber, polyurethane, or fluorine-containing rubber.

In the above configuration, appropriate elastic force is applied to the card housed in the tray.

A fifth aspect of the present invention is directed to the tray according to any one of the first to fourth aspects, wherein the first interior wall and the second interior wall may be formed of metal.

In the above configuration, the tray can be provided with high strength.

An electronic device according to a sixth aspect of the present invention includes the tray according to any one of the first to fifth aspects.

The above configuration provides the same advantageous effects as the first aspect.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A tray inserted in an electronic device, and housing a card removable from the electronic device, the tray comprising:
    a first interior wall partially defining a housing space housing the card;
    a second interior wall facing the first interior wall, and partially defining the housing space; and
    an elastic member provided to the second interior wall, wherein
    the elastic member is formed of rubber, and configured to change in shape in conformity with a shape of the card while the card is housed in the tray, and to apply to the card elastic force toward the first interior wall, wherein
    the tray further comprises a fall-out prevention stopper provided to define a bottom face of the housing space, and configured to prevent the card from falling out,
    in a case where a face facing the bottom face in the housing space is an open face, in a cross-sectional view of the elastic member illustrated on a plane determined by a direction in which the first interior wall and the second interior wall face each other and by a direction perpendicular to the bottom face, at least a portion of the elastic member is formed so that a side of the open face is larger in a thickness of the elastic member than a side of the bottom face.

2. The tray according to claim 1, wherein
    when the housing space has an open face facing the bottom face, in a cross-sectional view, of the elastic member, seen on a plane determined by a direction in which the first interior wall and the second interior wall face each other and by a direction perpendicular to the bottom face, at least a portion of the elastic member is formed so that a distance between a wall face of the elastic member and the first interior wall is longer toward the bottom face than toward the open face.

3. The tray according to claim 2, further comprising:
a third interior wall connecting together an end of the first interior wall and an end, of the second interior wall, facing the end of the first interior wall, the third interior wall partially defining the housing space; and
a fourth interior wall facing the third interior wall, and partially defining the housing space, wherein
the fall-out prevention stopper is provided to one of the third interior wall and the fourth interior wall.

4. The tray according to claim 1, wherein the rubber includes silicone rubber, polyurethane, or fluorine-containing rubber.

5. The tray according to claim 1, wherein the first interior wall and the second interior wall are formed of metal.

6. An electronic device comprising the tray according to claim 1.

* * * * *